(12) United States Patent
Miyagaki et al.

(10) Patent No.: US 7,142,048 B2
(45) Date of Patent: Nov. 28, 2006

(54) POP SOUND REDUCTION CIRCUIT AND VOICE OUTPUT AMPLIFICATION DEVICE

(75) Inventors: Kenichi Miyagaki, Kanagawa-ken (JP); Kouichi Yamashita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 909 days.

(21) Appl. No.: 10/253,864

(22) Filed: Sep. 25, 2002

(65) Prior Publication Data

US 2003/0058040 A1 Mar. 27, 2003

(30) Foreign Application Priority Data

Sep. 26, 2001 (JP) ........................... 2001-295094

(51) Int. Cl.
 *H03F 3/38* (2006.01)

(52) U.S. Cl. .................... 330/10; 330/207 A; 381/94.1
(58) Field of Classification Search ............... 330/10, 330/207 A, 251; 381/94.1, 94.5
See application file for complete search history.

(56) References Cited

U.S. PATENT DOCUMENTS

| 4,458,208 A | 7/1984 | Abe |
| 5,805,020 A * | 9/1998 | Danz et al. ............... 330/10 |
| 6,016,075 A * | 1/2000 | Hamo ....................... 330/10 |
| 6,300,825 B1 * | 10/2001 | Dijkmans et al. ........... 330/10 |
| 2001/0013808 A1 | 8/2001 | Fujisawe |

FOREIGN PATENT DOCUMENTS

| EP | 0 817 371 A1 | 1/1998 |
| EP | 1 049 247 A1 | 11/2000 |
| JP | 223536 | * 8/2001 ............... 330/10 |
| JP | 2001-223536 | 8/2001 |
| JP | 2001-223538 | 8/2001 |
| JP | 2001-244749 | 9/2001 |

* cited by examiner

*Primary Examiner*—Henry Choe
(74) *Attorney, Agent, or Firm*—Oblon, Spivak, McClelland, Maier & Neustadt, P.C.

(57) ABSTRACT

A pop sound reduction circuit comprises a pulse width modulation amplifier configured to amplify a reference voltage to an intermediate amplitude of a pulse width modulated signal, a first switch configured to activate and deactivate the pulse width modulation amplifier, a buffer amplifier configured to generate a DC voltage equal to the reference voltage, a second switch configured to activate and deactivate the buffer amplifier, and a control circuit configured to close and open the first and second switches complementary, depending on a potential in a leading region of the reference voltage which rises from a time of turning-on of a power source as well as a potential in a trailing region of the reference voltage which falls from a time of turning-off of the power source.

20 Claims, 4 Drawing Sheets

TRIANGULAR
WAVE FORM
OF PWM AMPLIFIER

OUTPUT
WAVE FORM
OF PWM AMPLIFIER

OUTPUT CURRENT

FIG.5B

TRIANGULAR
WAVE FORM
OF PWM AMPLIFIER

OUTPUT
WAVE FORM
OF PWM AMPLIFIER

OUTPUT CURRENT

POP SOUND REDUCTION CIRCUIT AND VOICE OUTPUT AMPLIFICATION DEVICE

CROSS REFERENCE TO RELATED APPLICATION

This application is based upon and claims the benefit of priority from the prior Japanese Patent Applications No. P2001-295094, filed on Sep. 26, 2001; the entire contents of which are incorporated herein by reference.

BACKGROUND OF THE INVENTION

1. Field of the Invention

The present invention relates to a pop sound reduction circuit which is applied to a voice output device constituted by semiconductor integrated circuits, and more particularly to a pop sound reduction circuit which reduces pop sound generated at the time when power is turned on/off and a voice output amplification device comprising the same.

2. Description of the Related Art

In terms of a voice output amplification device having a Single Ended Push-Pull (SEPP) circuit structure using a conventional switching system, typified a D-class amplifier, a power supply from one electric power source has been considered to be advantageous from the viewpoint of a circuit scale and cost. In the voice output amplification device having the SEPP circuit structure using the switching system, to which power is supplied from one electric power source, a pulse width modulation amplifier performs a switching operation at a constant frequency and a constant duty ratio (usually 50%) so that an output reference potential during a normal operation becomes equal to a predetermined DC value (usually about VCC/2). In this case, the output reference potential obtained by the switching operation by the pulse width modulation amplifier at the time when the power source is turned on reaches smoothly from a potential of a GND level to a predetermined output DC potential during the normal operation. During this period of time, noises having a frequency of an audio band should not be generated. However, it is actually difficult to obtain a transitional operation in which the output reference potential reaches from the GND potential level to the desired DC potential, by controlling an output switching frequency and a duty ratio. In the vicinity of the lowest operation voltage of the circuit itself, the switching frequency itself passes through the audio band, and thus the switching frequency may generate noises called pop sound. On the other hand, when the electric power source is turned off, the output reference potential decreases smoothly from the value during the normal operation to the GND level when the electric power source is turned off. During this period of time, no generation of noises having an audio frequency band is desired, and it is desirable that the circuit is stopped in a state where unnecessary noises occur after turning-off of the electric power source. However, it is difficult to control the output reference potential similarly to the time when the electric power source is turned on, and there is a possibility of occurrence of pop sound due to transitional variations of the switching frequency in the vicinity of the lowest operation voltage of the circuit itself.

To solve such a problem, in the voice output amplification device having the SEPP circuit structure using the switching system, to which power is supplied from one electric power source, a countermeasure to improve the level of the pop sound by canceling the voltage variation of GND by making the output a BLT structure and by making the power supplied from two electric power systems. However, when the BTL structure is adopted, the number of amplifiers per one channel is doubled, and when the voice output amplification device is powered from two electric power sources, the structure of the power sources become complex. Therefore, the voice output amplification device encounters a problem of high cost.

SUMMARY OF THE INVENTION

According to a first aspect of the present invention, a pop sound reduction circuit comprises a pulse width modulation amplifier configured to amplify a reference voltage to an intermediate amplitude of a pulse width modulated signal, a first switch configured to activate and deactivate the pulse width modulation amplifier, a buffer amplifier configured to generate a DC voltage equal to the reference voltage, a second switch configured to activate and deactivate the buffer amplifier, and a control circuit configured to close and open the first and second switches complementary, depending on a potential in a leading region of the reference voltage which rises from a time of turning-on of a power source as well as a potential in a trailing region of the reference voltage which falls from a time of turning-off of the power source.

According to a second aspect of the present invention, a voice output amplification device comprises a pulse width modulation amplifier configured to convert an input signal to a pulse width modulated signal by use of a triangular wave signal, a triangular wave oscillator configured to supply the triangular wave signal to the pulse width modulation amplifier, a reference voltage generator configured to generate a first reference voltage respectively having time constants in a leading region from a time of turning-on of a power source and a trailing region from a time of turning-off of the power source, an input amplifier configured to amplify the input signal to a predetermined potential to supply the amplified input signal to the pulse width modulation amplifier, a pop sound reduction circuit, and a power source line configured to supply a power source voltage, wherein the input signal is converted to the pulse width modulated signal which swings between the power source voltage and a ground potential, and then the pulse width modulated signal is delivered as an analog output signal at an output stage provided outside the voice output amplification device.

According to a third aspect of the present invention, a method for reducing pop sound comprises delivering a leading output voltage from a buffer amplifier by deactivating a pulse width modulation amplifier and activating the buffer amplifier complementary until first and second reference voltages reach a stable region of the pulse width modulation amplifier from a time of turning-on of a power source, delivering an output voltage from the pulse width modulation amplifier by activating the pulse width modulation amplifier and deactivating the buffer amplifier complementary after the first and second output reference voltages reach the stable region of the pulse width modulation amplifier, and delivering a trailing output voltage from the buffer amplifier by deactivating the pulse width modulation amplifier and activating the buffer amplifier complementary from a time just before the first and second reference voltages pass through the stable region from a time of turning-off of the power source.

DETAILED DESCRIPTION OF THE EMBODIMENT

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. In the following descriptions, numerous specific details are set forth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

Figure 1:
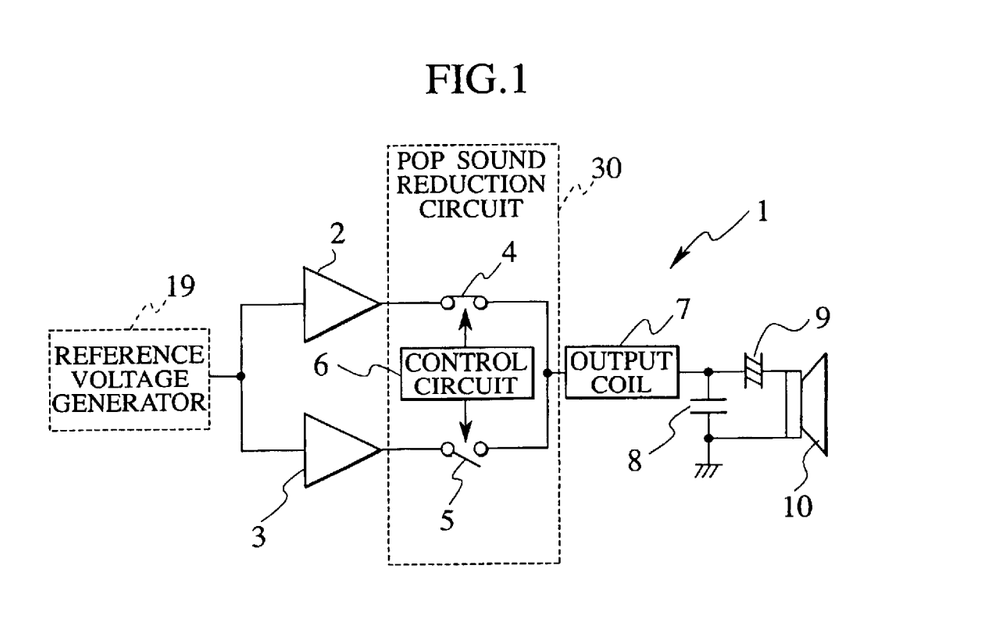
FIG. 1 is a block diagram for explaining a basic operation of a voice output amplification device comprising a pop sound reduction circuit according to an embodiment.

As shown in FIG. 1, a voice output amplification device 1 comprises a pulse width modulation amplifier (PWM) 2 which sets a reference voltage to an intermediate potential of an amplitude of a pulse width signal and converts an input signal to a pulse width modulated (PWM) signal by use of a triangular wave signal; a buffer amplifier 3 configured to generate a DC voltage equal to the reference voltage; and a pop sound reduction circuit 30. The pop sound reduction circuit 30 comprises a first switch 4 configured to open and close the output path from a PWM amplifier 2; a second switch 5 configured to open and close the output path from the buffer amplifier 3; and a control circuit 6 configured to control the first and second switches 4 and 5 to allow the output from one of the PWM amplifier 2 and the buffer amplifier 3 to be delivered. To an output stage of the voice output amplification device 1, coupled are an output coil 7, a filter capacitor 8, an output capacitor 9 and a speaker 10. A reference voltage generator circuit 19 is coupled to the voice output amplification device 1 so that the reference voltage, that is defined as a voltage at the intermediate potential during a normal operation, can be supplied to the voice output amplification device 1. Note that other signal inputs and a power source in the respective amplifiers are omitted.

Although the first and second switches 4, 5 open and close the output paths from the PWM 2 and buffer amplifier 3, the first and second switches can be employed such that the power supplies to the PWM 2 and buffer amplifier 3 are opened and closed.

Figure 2:
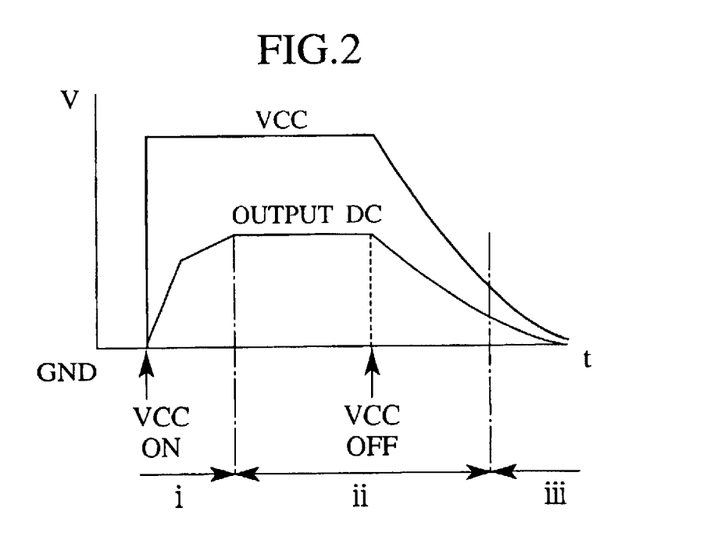
FIG. 2 is a voltage waveform diagram for a period of time from a power source on to a power source off in FIG. 1.

Next, operations of the voice output amplification device 1 shown in FIG. 1 at the time when the power supply path is opened and closed will be described with reference to FIG. 2.

For a period of time until the reference voltage reaches a stable operation voltage region of the PWM amplifier 2 after turning-on of the power source (period i of FIG. 2), the control circuit 6 opens the first switch 4 and closes the second switch 5, thus allowing only the output from the buffer amplifier 3 can be delivered. Since a predetermined time constant is imparted to the reference voltage that is being supplied to the buffer amplifier 3, an output voltage OUTPUT DC from the buffer amplifier 3 rises gradually. Subsequently, when the reference voltage reaches the stable operation voltage region of the PWM amplifier 2, the control circuit 6 closes the first switch 4 and opens the second switch 5, thus the output from the PWM amplifier 2 can be delivered. For a period of time ii after the output reference voltage reached the stable operation voltage region of the PWM amplifier 2 (in the stable operation voltage region of the PWM amplifier 2), a PWM signal which was converted from the input signal is delivered as an output signal in the PWM amplifier 2. This PWM signal is a switching waveform signal which sets the reference voltage to the intermediate amplitude of the PWM signal and alternates between the power source voltage VCC and the ground potential GND. Each pulse is modulated to a time width in accordance with the input signal.

In the above described manner, the output voltage OUTPUT DC is delivered from the buffer amplifier 3 until the reference voltage reaches the stable operation voltage region of the PWM amplifier 2, and the PWM amplifier 2 is operated after the reference voltage reached the stable operation voltage region of the PWM amplifier 2, whereby it is possible to reduce the occurrence of abnormal sound and pop sound due to an unstable operation of the PWM amplifier 2 at the time when the power source VCC is turned on. Furthermore, as described later, by exchanging the output of the amplifier 2, 3 at a timing such that current fluctuation at the output stage of the voice output amplification device 1 becomes minimum, it is possible to further decrease the pop sound.

When the power source VCC is turned off, on the contrary to the turning-on of the power source VCC, the control circuit 6 opens the first switch 4 and closes the second switch 5 before the reference voltage passes through the stable operation voltage region of the PWM 2, thus allowing the delivery of the output from the buffer amplifier 3. During the period iii after the turning-off of the power source VCC, the output voltage OUTPUT DC from the buffer amplifier 3 gradually decreases, and then becomes equal to the GND level.

As described above, by exchanging the output voltage from the PMW amplifier 2 to that from the buffer amplifier 3 immediately before the reference voltage passes through the stable operation voltage region of the PWM amplifier 2, it is possible to reduce the occurrence of the abnormal sound and pop sound due to a failure operation of the PWM amplifier 2 at the time of the turning-off of the power source. Furthermore, as described later, it is possible to further reduce the pop sound by exchanging the output from the amplifier 2, 3 at a timing such that current fluctuation at the output stage of the voice output amplification device 1 is becomes minimum.

Figure 3:
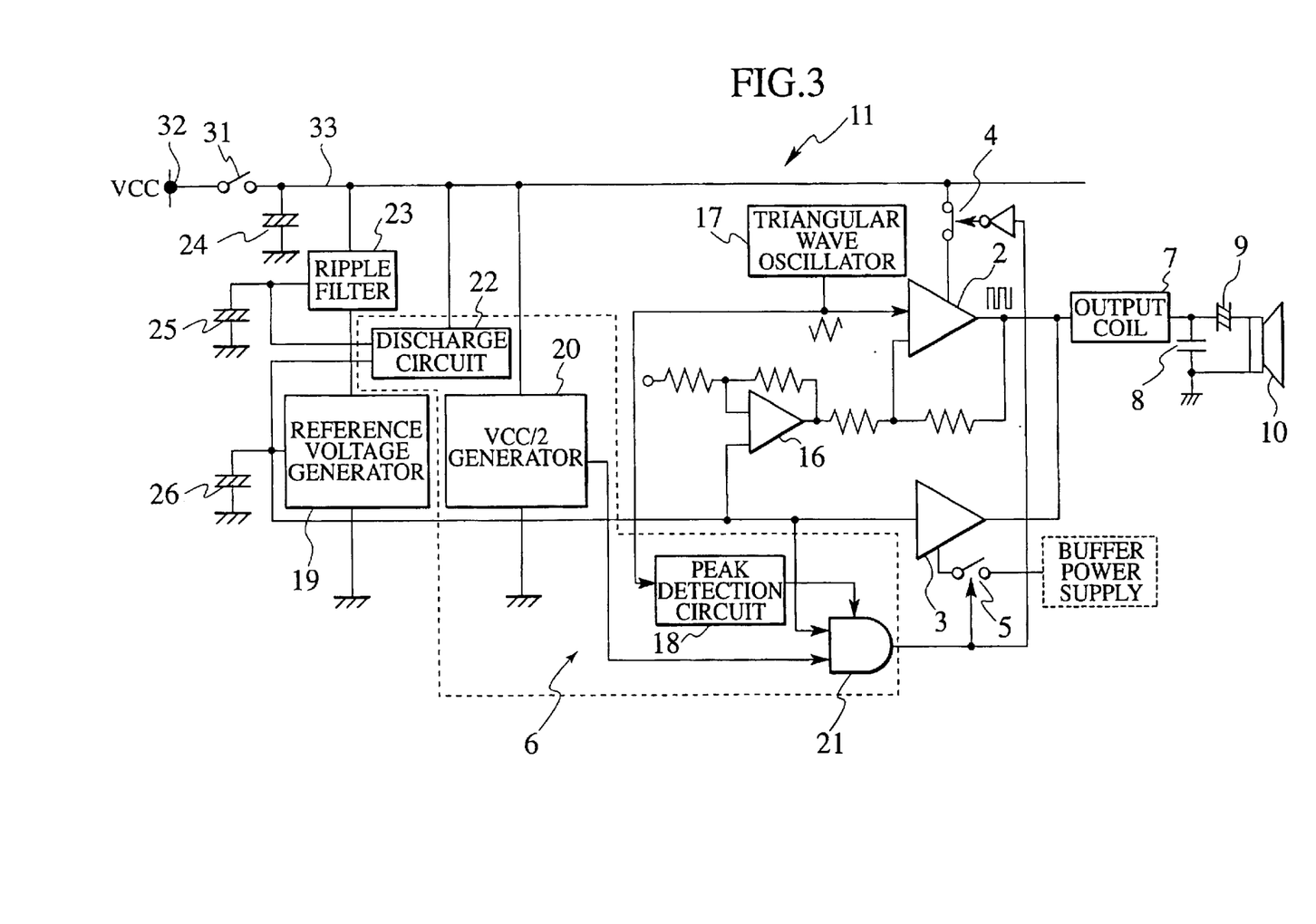
FIG. 3 is a circuit constitution view of the voice output amplification device comprising the pop sound reduction circuit according to the embodiment.

FIG. 3 is another circuit configuration of the voice output amplification device according to the embodiment of the present invention, which shows the SEPP circuit using the above mentioned exchanging system, wherein the power supply to the amplifier 2, 3 is exchanged using one electric power source 32. The PWM amplifier 2 compares an analog input signal, for example, an audio signal, which is supplied from an input amplifier 16, and a triangular wave signal which is supplied from a triangular wave oscillator 17, and converts the input signal to the PWM signal by the PWM operation, thus outputting the PWM signal. The PWM amplifier 2 shown in FIG. 3 is constituted by a PWM comparator and an output circuit amplifier. The power source voltage VCC is supplied to the PWM amplifier 2 through a first switch 4.

The buffer amplifier 3 is a linear amplifier for generating a DC voltage equal to the reference voltage VCC/2. The buffer amplifier 3 generates an output voltage equivalent to the reference voltage for a period of time until the output reference voltage reaches the stable operation voltage region of the PWM amplifier 2 after the reference voltage stabilizes at VCC/2 after turning-on of the power source. Also at the time of the turning-off of the power source, the buffer amplifier 3 is activated immediately before the reference voltage passes through the stable operation voltage region of the PWM amplifier 2, and the buffer amplifier 3 outputs the output voltage which gradually falls to the GND level. Moreover, at the time of the turning-off of the power source, the buffer amplifier 3 discharges charges remaining in the output stage to the outside.

The switching of the first and second switches 4 and 5 are controlled complementarily depending on the output signal from a hysteresis comparator 21. Specifically, when the first switch 4 is closed, the second switch is opened. When the first switch 4 is opened, the second switch 5 is closed.

The input amplifier 16 amplifies the analog input signal by use of the reference voltage delivered from an reference voltage generator 19.

The triangular wave oscillator 17 generates the triangular signal, which is compared with the input signal in the PWM amplifier 2. The triangular wave signal generated in the triangular wave oscillator is transmitted to the PWM amplifier 2 and a peak detection circuit 18.

Instead of the triangular wave signal, a sawtooth wave signal can be also used. However, when the sawtooth signal is used, the position of the peak voltage and the position where fluctuation of the output current at the output stage becomes minimum do not coincide with each other temporally. Accordingly, the phase of the peak voltage must be corrected. For this reason, for example, a circuit for correcting the phase may be provided at the front stage of the peak detection circuit 18, or the configuration of the voice output amplification device is modified so that the sawtooth signal is supplied only to the PWM amplifier 2, and a triangular wave signal from the triangular wave oscillator 17 in synchronization with the sawtooth signal is supplied to the peak detection circuit 18.

The peak detection circuit 18 detects a peak voltage of the triangular wave signal generated by the triangular wave oscillator 17, and provides a detection signal to the hysteresis comparator 21 at a timing when the peak voltage is detected.

The reference voltage generator 19 generates the reference voltage VCC/2 that serve as the operation reference voltages of the PWM amplifier 2 and the buffer amplifier 3. The foregoing PWM amplifier 2 sets the reference voltage to the intermediate potential of the amplitude of the PWM signal, and generates the PWM signal which swings between the power source voltage VCC and the ground potential GND. The reference voltage delivered from the PWM amplifier 2 has time constants at the leading region spanning from the time of he turning-on the power source and at the trailing region after the time of the turning-off the power source, respectively. Specifically, the reference voltage provided by the PWM amplifier 2 rises to VCC/2 with a predetermined leading time from the time of the turning-on the power source, and decreases from VCC/2 to the GND level with a predetermined breaking time from the time of the turning-off the power source. Note that the power source voltage VCC 32 is supplied to the reference voltage generator 19 through a ripple filter 23 via a power source line 33, and the time constant is imparted by a capacitor 26 provided at the outside.

The reference voltage corresponds to a first reference voltage in this embodiment, and is supplied to the buffer amplifier 3 and the hysteresis comparator 21 through a power source input line (not shown).

A VCC/2 generator 20 generates a VCC/2 for the output detection to be supplied to the hysteresis comparator 21. The VCC/2 for the output detection is an intermediate potential between the power source VCC and the ground potential GND similar to the reference voltage VCC/2, and the VCC/2 for the output detection is used for detecting a timing when the value of reference voltage becomes equal to the VCC/2 for the output detection. Therefore, the VCC/2 for the output detection has no time constant in the leading region beginning from the time of the turning-on of the power source and in the trailing region beginning from the time of the turning-off of the power source, and rises to VCC/2 immediately after the turning-on of the power source. In the case of the turning-off of the power source, the VCC/2 for the output detection decrease to the GND level while keeping the potential of VCC/2. Actually, the VCC/2 for the output detection does not become equal to the GND level immediately due to influences of residual charges.

The VCC/2 for the output detection corresponds to a second reference voltage in this embodiment.

The hysteresis comparator 21 compares the output reference voltage and the VCC/2 for the output detection with each other, and drives the first and second switches 4 and 5 at the time when both of the value of reference voltage and the VCC/2 for the output detection becomes equal to each other. Specifically, the hysteresis comparator 21 outputs a detection signal at the time when the value of reference voltage which rises immediately after the turning-on of the power source becomes approximately equal to the VCC/2 for the output detection, as well as at the time when the reference voltage which is not supplied after the turning-off of the power source becomes approximately equal to the VCC/2 for the output detection. Then, the hysteresis comparator 21 drives the first and second switches 4 and 5 complementarily. The hysteresis comparator 21 monitors the detection signal from the peak detection circuit 18, and drives the foregoing first and second switches 4 and 5 at the timing of the detection signal. Note that the hysteresis comparator 21 constitutes a comparison circuit in this embodiment.

A discharge circuit 22 is a circuit for controlling the slope of the trailing region of the foregoing reference voltage VCC/2 so that the reference voltage VCC/2 provided by the reference voltage generator 19 after the tuning-off of the power source is decreases while keeping approximately the intermediate potential of the power source voltage VCC. Such a control of the slope is necessary for making the operation timing in the hysteresis comparator 21 proper, which drives the switches at the time when the reference voltage and the VCC/2 for the output detection become approximately equal to each other. Thus, it is possible to allow the buffer amplifier 3 to operate before the reference voltage passes through the stable operation voltage region of the PWM amplifier 2 at the time of the turning-off of the power source, that is, before the PWM amplifier 2 causes the failure operation.

Moreover, a power source decoupling capacitor 24, a ripple filter capacitor 25 and the VCC/2 bias capacitor 26 are coupled to the voice output amplification device 11, and the output coil 7, the filter capacitor 8, the output capacitor 9 and the speaker 10 are coupled thereto as the output stage.

Note that the power source (VCC) 32 is supplied to each section of the voice output amplification device 11 through a power source switch 31.

In the voice output amplification device 11 shown in FIG. 3, the peak detection circuit 18, the VCC/2 generator 20, the hysteresis comparator 21 and the discharge circuit 22 constitute the control circuit 6 shown in FIG. 1.

Figure 4A:
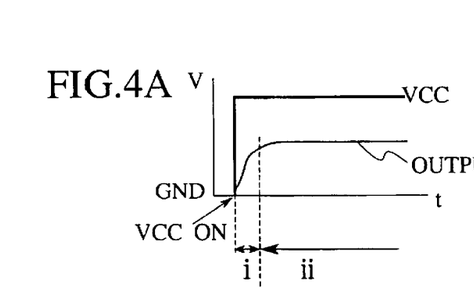
FIGS. 4A to 4F are voltage waveform diagrams for a period of time from the power source on to the power source off.
Figure 4B:
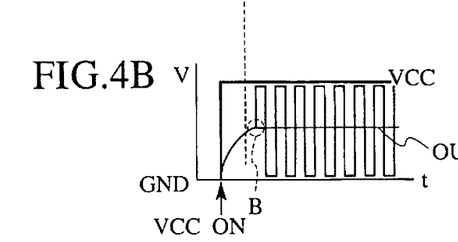
Figure 4C:
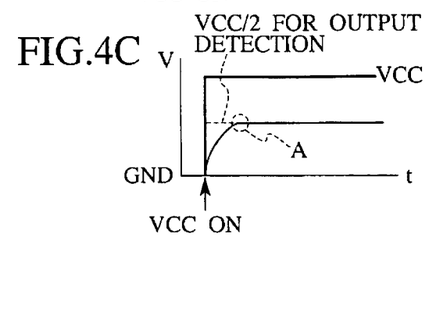
Figure 4D:
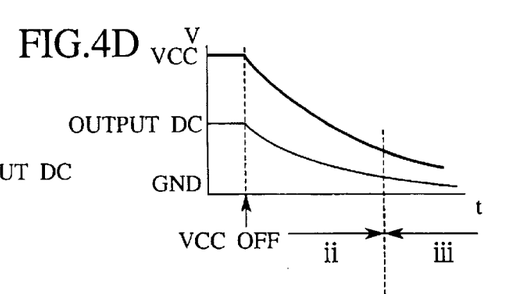
Figure 4E:
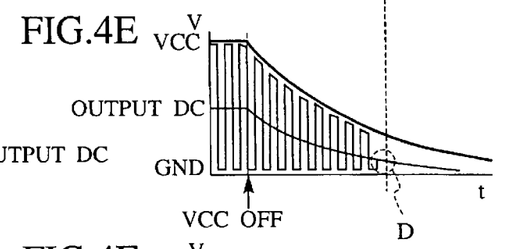
Figure 4F:
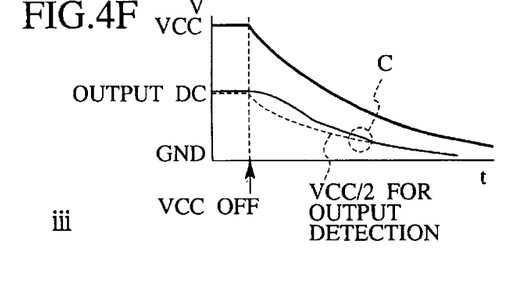

Next, the operation exchanging the supply from the power source in the voice output amplification device 11 shown in FIG. 3 will be described with reference to FIG. 4. FIGS. 4A to 4C show the voltage waveform at the time of the turning-on of the power source respectively, and FIGS. 4D to 4F show the voltage waveform at the time of the turning-off of the power source respectively. FIG. 4A and FIG. 4D are graphs comparing the power source voltage VCC and the output voltage (output DC). FIG. 4B and FIG. 4E are obtained by superposing the PWM signal output from the PWM amplifier 2 onto the waveforms of FIG. 4A and FIG. 4D. Moreover, FIG. 4C and FIG. 4F are obtained by superposing the VCC/2 for the output detection onto the waveforms of FIG. 4A and FIG. 4D.

Note that the graph in the period ii among the graphs of the output DC shown in the respective voltage waveforms shows the voltage value at that time virtually and does not show that an actual output DC exist.

Turning on of Power Source

First, the operation at the time when the power source is turned on will be described.

The power source voltage VCC and the VCC/2 for the output detection rise at the timing of the turning-on of the power source (VCC ON), as shown in FIG. 4C. At this time, since the first switch 4 is opened and the second switch 5 is closed, only the buffer amplifier 3 operates. Since the output from the buffer amplifier 3, to which the reference voltage VCC/2 is given, has a time constant in its leading region, the output voltage begins to rise more gradually compared to the VCC/2 for the output detection, as shown in FIG. 4A. The period i of FIG. 4A indicates a period where the operation of the PWM amplifier 2 is unstable, and the output voltage from the buffer amplifier 3 is delivered to the output stage during this period.

The hysteresis comparator 21 compares the reference voltage VCC/2 and the VCC/2 for the output detection with each other. The hysteresis comparator 21 delivers the detection signal at the time when the reference voltage VCC/2 and the VCC/2 of the output detection becomes approximately equal to each other, that is, at the time when both of the voltages reach the region A of FIG. 4C, and close the first switch 4 and open the second switch 5. At the region A the operation of the PWM amplifier 2 being unstable shifts to the period in which the operation thereof is fully stable. Afterward, the PWM amplifier 2 operates at the stable region (period ii), as shown in FIG. 4A.

At the same time, the hysteresis comparator 21 monitors also the detection signal from the peak detection circuit 18, and drives the two switches at the timing of this detection signal. Specifically, the timing at which the hysteresis comparator 21 closes the first switch 4 and opens the second switch 5 is a timing at which the reference voltage and the VCC/2 for the output detection becomes approximately equal to each other and the detection signal is delivered from the peak detection circuit 18.

After the period ii in which the reference voltage reaches the stable region of the PWM amplifier 2, the PWM signal obtained by converting the input signal thereto by the PWM amplifier 2 is provided as the output voltage, as shown in FIG. 4B. As described above, the output voltage is delivered from the buffer amplifier 3 until the reference voltage reaches the stable region of the PWM amplifier 2 after the turning-on of the power source, and the PWM amplifier 2 is operated after the reference voltage reaches the stable region of the PWM amplifier 2, whereby it is possible to reduce the occurrence of the abnormal sound and the pop sound due to the unstable operation of the PWM amplifier 2 at the time of the turning-on of the power source. In addition, the peak voltage of the triangular wave signal is detected, and the exchanging operation is performed at this detection timing, whereby it is possible to further reduce the pop sound. The reason of this face will be described.

Figure 5A:
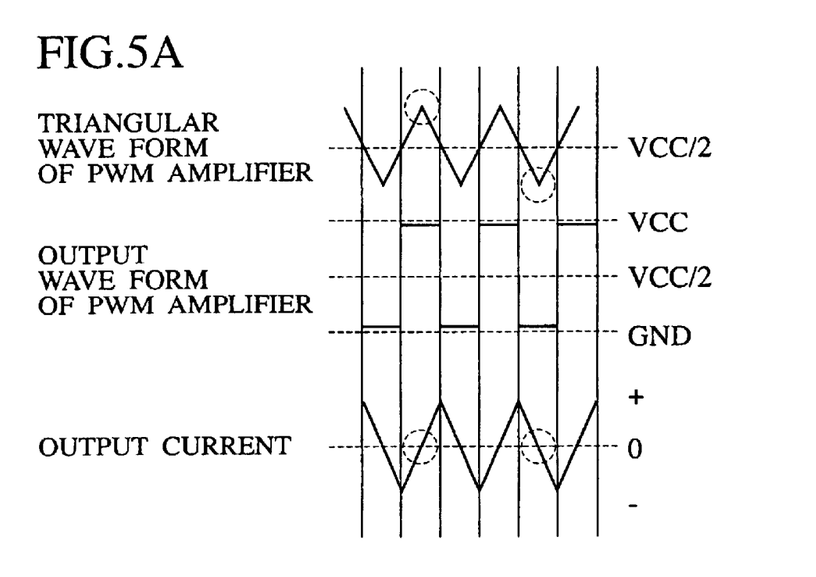
FIGS. 5A and 5B are waveform diagrams illustrating a relation between a triangular waveform signal and an output current appearing at an output stage.
Figure 5B:
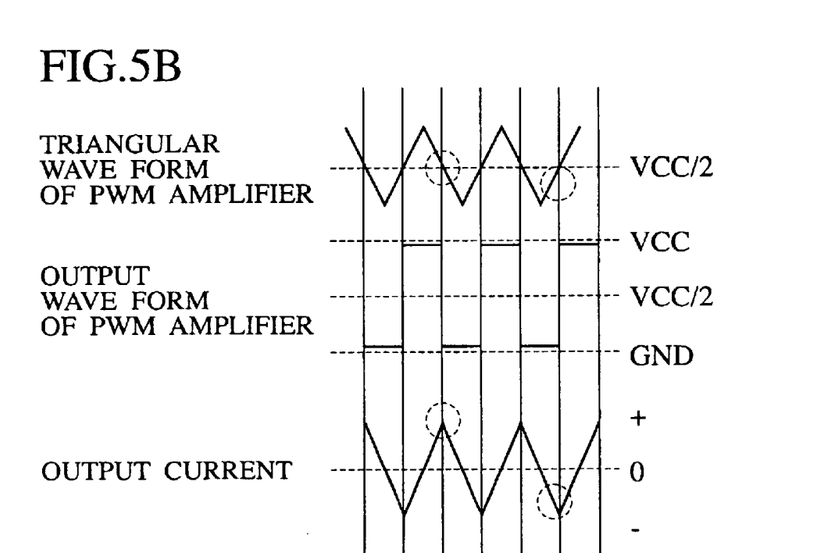

As shown in FIG. 5A, the peak detection circuit 18 detects the peak voltage of the triangular wave signal (the region indicated by the symbol ○ in FIG. 5A), and provides the detection signal every time when the circuit 18 detects the peak voltage. When the opening/closing of the switches 4, 5 is performed at the peak voltage portion of the triangular wave signal and the PWM amplifier 2 is activated in the above described manner, it is possible to operate the PWM amplifier 2 at the timing when the current fluctuation at the output stage is minimum, that is, at the timing when energy supplied to the both ends of the output coil 7 becomes minimum value. On the other hand, as shown in FIG. 5B, when the complementary operation of the switches is performed without detecting the peak voltage of the triangular wave signal, the energy supplied to the output coil 7 coupled to the output stage changes depending on the phase of the switching waveform at the time when the switching operation is performed, and current induced by this energy may cause the pop sound.

As described above, when the PWM amplifier 2 is activated at the timing when the peak voltage is detected and the current fluctuation at the output stage becomes minimum, the PWM operation starts from the voltage level of the reference voltage that is the intermediate potential as shown by the symbol B in FIG. 4B, and the occurrence of the pop sound due to the current fluctuation at the output stage can be suppressed. This fact holds true not only at the time of the turning-on of the power source, but also at the time of the turning-off of the power source.

Turning Off of Power Source

Next, the operation of the voice output amplification device 2 when the power source is turned off will be described.

At a timing when the power source is turned off (VCC OFF), the power source voltage VCC and the VCC/2 for the output detection fall as shown in FIG. 4F. The PWM signal provides by the PWM amplifier 2 at this time decreases its amplitude gradually as the reference voltage falls as shown in FIG. 4E. Moreover, since the reference voltage has the time constant in the trailing region, the reference voltage begins to fall more gradually compared to the VCC/2 for the output detection.

The hysteresis comparator 21 compares the reference voltage and the VCC/2 for the output detection with each other, and outputs the detection signal at the time when the reference voltage and the VCC/2 for the output detection become approximately equal to each other, that is, at the time when both reach the region C of FIG. 4F. The hysteresis comparator 21 opens the first switch 4, and closes the second switch 5. The region C is a region where shifting is made from the period in which the operation of the PWM amplifier 2 is stable to the period in which the operation thereof is unstable. Afterward, the PWM amplifier 2 operates outside the stable region (period iii).

Also at this time, the hysteresis comparator 21 monitors the detection signal from the peak detection circuit 18, and performs the complementary switching of the two switches 4, 5 at the timing of this detection signal. Specifically, the timing at which the hysteresis comparator 21 opens the first switch 4 and closes the second switch 5 is a timing at which the reference voltage and the VCC/2 for the output detection becomes approximately equal to each other and the detection signal is delivered from the peak detection circuit 18.

After the period iii in which the reference voltage passes through the stable region of the PWM amplifier 2, delivery of the PWM signal from the PWM amplifier 2 is stopped as shown in FIG. 4E, and the output voltage which falls is delivered from the buffer amplifier 3. As described above, the output voltage is taken out from the PMW amplifier 2 until the reference voltage passes through the stable region of the PWM amplifier 2 after the turning-off of the power source, and the output exchange is made from the PWM amplifier 2 to the buffer amplifier 3 immediately before the reference voltage passes through the stable region of the PWM amplifier 2, whereby it is possible to reduce the occurrence of the abnormal sound and the pop sound due to the failure operation of the PWM amplifier 2 at the time of the turning-off of the power source. In addition, the peak voltage of the triangular wave signal is detected in the similar manner to that at the time of the turning-on of the power source, whereby it is possible to further reduce the pop sound. Specifically, as shown by the symbol D in FIG. 4E, the PWM operation is stopped when the output voltage becomes the reference voltage that is the intermediate potential, and it is possible to suppress the occurrence of the pop sound owing to the current fluctuation at the output stage.

At the time when the power source is turned off, charges remaining at the output capacitor 9 and the like at the output stage are discharged to the outside of the voice output amplification device 11 through the buffer amplifier 3.

In the voice output amplification device 11 having the SEPP structure using the output exchange system as shown in FIG. 3, to which the power is supplied from one electric power source, the number of amplifiers per one channel need not to be doubled unlike the case where the output stage is constituted by the BTL structure, and the structure of the power source is not complicated unlike the case where two power sources is used for the operation. Accordingly, the reduction of the pop sound can be realized with a lower cost compared to the improvement technique by the conventional structure.

Various modifications will become possible for those skilled in the art after receiving the teachings of the present invention disclosure without departing from the scope thereof.

What is claimed is:

1. A pop sound reduction circuit, comprising:
   a pulse width modulation amplifier configured to amplify a reference voltage to an intermediate amplitude of a pulse width modulated signal;
   a first switch configured to activate and deactivate the pulse width modulation amplifier;
   a buffer amplifier configured to generate a DC voltage equal to the reference voltage;
   a second switch configured to activate and deactivate the buffer amplifier; and
   a control circuit configured to close and open the first and second switches complementary, depending on a potential in a leading region of the reference voltage which rises from a time of turning-on of a power source as well as a potential in a trailing region of the reference voltage which falls from a time of turning-off of the power source.

2. The pop sound reduction circuit according to claim 1, wherein the control circuit opens the first switch and closes the second switch until the reference voltage supplied, from a time of turning-on of the power source, reaches a stable region of the pulse width modulation amplifier so as to deliver a leading output voltage from the buffer amplifier; and
   the control circuit closes the first switch and opens the second switch after the reference voltage reaches the stable region so as to deliver an output voltage from the pulse width modulation amplifier; and
   the control circuit opens the first switch and closes the second switch from a time immediately after a time of turning-off of the power source so as to deliver a trailing output voltage from the buffer amplifier.

3. The pop sound reduction circuit according to claim 1, wherein charges remaining at an output stage of the buffer amplifier after the turning-off of the power source are discharged from the buffer amplifier.

4. The pop sound reduction circuit according to claim 1, wherein the control circuit includes a voltage input line supplied with a first reference voltage having time constants respectively in a leading region firm a time of turning-on of the power source and in a trailing region from a time of turning-off of the power source.

5. The pop sound reduction circuit according to claim 4, wherein the control circuit further includes a voltage generator for a detection voltage for generating a second reference voltage which has no time constant in the leading region and in the trailing region.

6. The pop sound reduction circuit according to claim 5, wherein the control circuit further includes a comparing circuit configured to activate one of the pulse width modulation amplifier and the buffer amplifier by complementary operating the first and second switches at the time when a potential of the first reference voltage, which rises from the time of the turning-on of the power source, becomes approximately equal to that of the second reference voltage, as well as at the time when the power source turns off.

7. The pop sound reduction circuit according to claim 6, wherein the time when the potentials of the first and second reference voltages which rise from the time of the turning-on of the power source becomes approximately equal to each other is set to a stable region of the pulse width modulation amplifier, and the time when the power source turns off.

8. The pop sound reduction circuit according to claim 7, wherein
   the comparing circuit opens the first switch and closes the second switch until the first and second reference voltages reach a stable region of the pulse width module amplifier from the time of the turning-on of the power source so as to deliver a leading output voltage from the buffer amplifier; and
   the comparing circuit closes the first switch and opens the second switch after the first and second reference voltages reach the stable region of the pulse width module amplifier so as to deliver an output voltage from the pulse width modulation amplifier; and
   the comparing circuit opens the first switch and closes the second switch from a time when the power source turns off so as to deliver a trailing output voltage from the buffer amplifier.

9. The pop sound reduction circuit according to claim 6, further comprising a peak detection circuit configured to detect a peak voltage of a triangular wave signal supplied to the pulse width modulation amplifier and to generate a detection signal at a timing of detection of the peak voltage.

10. The pop sound reduction circuit according to claim 9, wherein the first and second switches are complementary operated when the first and second reference voltages lie in the stable region and the detection signal is provided from the peak detection circuit.

11. The pop sound reduction circuit according to claim 6, further comprising a discharging circuit configured to control a slope of the trailing region of the first reference voltage having the time constant.

12. The pop sound reduction circuit according to claim 11, wherein the slope of the trailing region of the first reference voltage after turning-off of the power source is controlled so that the first reference voltage decreases while keeping approximately intermediate potential of the power source voltage.

13. The pop sound reduction circuit according to claim 9, further comprising a discharging circuit configured to control a slope of the trailing region of the first reference voltage having the time constant.

14. The pop sound reduction circuit according to claim 13, wherein the slope of the trailing region of the first reference voltage after turning-off of the power source is controlled so that the first reference voltage decreases while keeping approximately intermediate potential of the power source voltage.

15. The pop sound reduction circuit according to claim 6, wherein charges remaining at an output stage of the buffer amplifier at the turning-off of the power source are discharged from the buffer amplifier.

16. The pop sound reduction circuit according to claim 6, wherein the comparing circuit is a hysteresis circuit.

17. A voice output amplification device, comprising:
a pulse width modulation amplifier configured to convert an input signal to a pulse width modulated signal by use of a triangular wave signal;
a triangular wave oscillator configured to supply the triangular wave signal to the pulse width modulation amplifier;
a reference voltage generator configured to generate a reference voltage respectively having time constants in a leading region from a time of turning-on of a power source and a trailing region from a time of turning-off the power source;
an input amplifier configured to amplify the input signal to a predetermined potential to supply the amplified input signal to the pulse width modulation amplifier;
a power source line configured to supply a power source voltage; and
a pop sound reduction circuit comprising:
a first switch configured to activate and deactivate the pulse width modulation amplifier;
a buffer amplifier configured to generate a DC voltage equal to the reference voltage;
a second switch configured to activate and deactivate the buffer amplifier; and
a control circuit configured to close and open the first and second switches complementarily, depending on a potential in the leading region of the reference voltage that rises from a time of turning-on of a power source, as well as a potential in the trailing region of the reference voltage that falls from a time of turning-off of the power source,
wherein the input signal is converted to a pulse width modulated signal that varies between the power source voltage and a ground potential, and the pulse width modulated signal is delivered as an analog output signal at an output stage provided outside the voice output amplification device.

18. The voice output amplification device according to claim 17, wherein the pulse width modulation amplifier comprises a pulse width modulation comparator and an output circuit amplifier.

19. A method for reducing pop sound, comprising:
delivering a leading output voltage from a buffer amplifier by deactivating a pulse width modulation amplifier and activating the buffer amplifier complementary until first and second reference voltages reach a stable region of the pulse width modulation amplifier from a time of turning-on of a power source;
delivering an output voltage from the pulse width modulation amplifier by activating the pulse width modulation amplifier and deactivating the buffer amplifier complementary after the first and second output reference voltages reach the stable region of the pulse width modulation amplifier; and
delivering a trailing output voltage from the buffer amplifier by deactivating the pulse width modulation amplifier and activating the buffer amplifier complementary from a time just before the first and second reference voltages pass through the stable region from a time of turning-off of the power source.

20. The method for reducing pop sound according to claim 19, wherein
a peak voltage of a triangular wave signal supplied to the pulse width modulation amplifier is detected and a detection signal is generated; and
the pulse width modulation amplifier and the buffer amplifier are complementary activated at a timing of the detection signal.

* * * * *